United States Patent
Watt et al.

(10) Patent No.: US 9,331,026 B1
(45) Date of Patent: May 3, 2016

(54) METHODS AND APPARATUS FOR FABRICATING CAPACITOR STRUCTURES WITH A TERMINAL SHIELD

(71) Applicant: Altera Corporation, San Jose, CA (US)

(72) Inventors: Jeffrey T. Watt, Palo Alto, CA (US); Shuxian Chen, Fremont, CA (US)

(73) Assignee: Altera Corporation, San Jose, CA (US)

( * ) Notice: Subject to any disclaimer, the term of this patent is extended or adjusted under 35 U.S.C. 154(b) by 77 days.

(21) Appl. No.: 14/274,499

(22) Filed: May 9, 2014

(51) Int. Cl.
*H01L 23/00* (2006.01)
*H01L 49/02* (2006.01)

(52) U.S. Cl.
CPC .............. *H01L 23/564* (2013.01); *H01L 28/60* (2013.01); *H01L 28/86* (2013.01)

(58) Field of Classification Search
CPC ........ H01L 23/564; H01L 28/60; H01L 28/86
USPC ........................................................... 257/534
See application file for complete search history.

(56) References Cited

U.S. PATENT DOCUMENTS

| | | | |
|---|---|---|---|
| 6,285,573 B1 | 9/2001 | Park | |
| 6,737,698 B1 | 5/2004 | Paul et al. | |
| 7,259,956 B2 | 8/2007 | Fong et al. | |
| 7,978,456 B2 | 7/2011 | Fong et al. | |
| 8,000,083 B2 | 8/2011 | Fong et al. | |
| 8,106,479 B1 | 1/2012 | Nathawad | |
| 8,187,944 B2 | 5/2012 | Nathawad | |
| 8,570,707 B2 | 10/2013 | Fong et al. | |
| 2013/0228894 A1* | 9/2013 | Yen | H01L 23/5223 257/532 |

* cited by examiner

*Primary Examiner* — Karen Kusumakar
*Assistant Examiner* — Adam S Bowen

(57) ABSTRACT

A capacitor structure having a complete terminal shield is provided. The capacitor structure may include a first conductive segment with a first set of conductive fingers and a second segment structure with a second set of conductive fingers. The second set of conductive fingers may be spatially interleaved with the first set of conductive fingers in the first conductive structure. The first conductive segment may receive a first voltage, whereas the second conductive segment may receive a second voltage that is different than the first voltage. The capacitor structure further includes a conductive shielding structure that is connected to the first conductive segment. The conductive shielding structure may laterally surround the second conductive segment from at least three sides. An additional conductive shielding structure that connects to the first and second conductive segments is formed directly above the first and second conductive segments.

20 Claims, 7 Drawing Sheets

METHODS AND APPARATUS FOR FABRICATING CAPACITOR STRUCTURES WITH A TERMINAL SHIELD

BACKGROUND

High-capacitance capacitors such as finger metal oxide metal (FMOM) capacitors are widely used in various types of analog and digital circuits such as phase-lock loops (PLLs) and voltage-controlled oscillators (VCOs), etc. Generally, such a capacitor has two sets of parallel conductive lines or fingers. Each set of fingers may be connected to a terminal of the capacitor. The capacitance of an FMOM capacitor depends on the number of conductive lines that are connected to a voltage terminal, and their respective length, width, and distance to neighboring conductive lines that are connected to another voltage terminal.

In general, two or more sub-capacitors may be stacked on a semiconductor substrate to form a high-density capacitor structure with high capacitance. However, such a capacitor structure may also increase the parasitic capacitance in the capacitor structure due to fabrication constraints (e.g., metal density rules). Parasitic capacitance (also referred to as stray capacitance or self-capacitance) is one of the physical constraints that limits the performance of integrated circuits. Parasitic capacitance may exist within parts of an integrated circuit or component due to their proximity to each other. As such, the presence of parasitic capacitance may further increase capacitive coupling between adjacent metal layers in the capacitor structure and this may interfere with normal circuit operations.

Additionally, the presence of parasitic capacitance may create variations in capacitance from the capacitor structure to unwanted stray capacitance effects (e.g., noise, cross talks). For example, one terminal of the capacitor structure that charges and discharges current may create parasitic capacitance imbalance with the other terminal of the capacitor structure. The variation in parasitic capacitance between terminals in the capacitor structure may cause the linearity of the integrated circuit to be affected, which in turn may degrade circuit performance.

SUMMARY

In accordance with the present invention, apparatus and methods are provided for fabricating a capacitor structure with a complete terminal shield.

It is appreciated that the present invention can be implemented in numerous ways, such as a process, an apparatus, a system, or a device. Several inventive embodiments of the present invention are described below.

A capacitor structure with first and second terminals that is formed in a dielectric stack over a substrate is provided. The capacitor structure includes a first conductive segment is formed in a first layer of the dielectric stack, whereas a second conductive segment is formed in a second layer of the dielectric stack. A third conductive segment is formed in the second layer of the dielectric stack, where the third conductive segment is connected to the first conductive segment. The first and second conductive segments are coupled to the first terminal of the capacitor structure, and the third conductive segment is coupled to the second terminal of the capacitor structure. Subsequently, a conductive shielding structure is formed directly above the third conductive segment in a third layer of dielectric stack, where the conductive shielding structure is coupled to the second conductive segment.

An integrated circuit is provided. The integrated circuit includes a semiconductor substrate and dielectric layers above the semiconductor substrate. A layer in the dielectric layers has a first conductive structure with a first set of conductive fingers and a second conductive structure with a second set of conductive fingers that is spatially interleaved with the first set of conductive fingers. Accordingly, a conductive shielding structure may connect to the first conductive structure and may laterally surround the second conductive structure from at least three sides. The integrated circuit further includes an additional conductive shielding structure that is formed directly above the first and second conductive structures in another layer in the dielectric layers.

A method of fabricating a capacitor structure on a substrate is provided. The method includes forming a dielectric stack on the substrate. A first conductive structure is formed in a first layer of the dielectric stack and a second conductive structure with a second set of conductive fingers is formed in a second layer of the dielectric stack. The second layer of the dielectric stack is adjacent to and above the first layer of dielectric stack. A third conductive structure with a second set of conductive fingers is also formed in the second layer of the dielectric stack, where the first set of conductive fingers is spatially interleaved with the second set of conductive fingers. The method further includes forming a conductive shielding structure that is connected to the first and second conductive structure. The conductive shielding structure laterally surrounds the third conductive structure from three sides.

Further features of the invention, its nature and various advantages, will be more apparent from the accompanying drawings and the following detailed description of the preferred embodiments.

DETAILED DESCRIPTION

The embodiments provided herein include integrated circuit structures and packaging techniques for fabricating capacitor structure with a complete terminal shield.

It will be obvious, however, to one skilled in the art, that the present exemplary embodiments may be practiced without some or all of these specific details. In other instances, well-known operations have not been described in detail in order not to obscure unnecessarily the present embodiments.

Figure 1A:
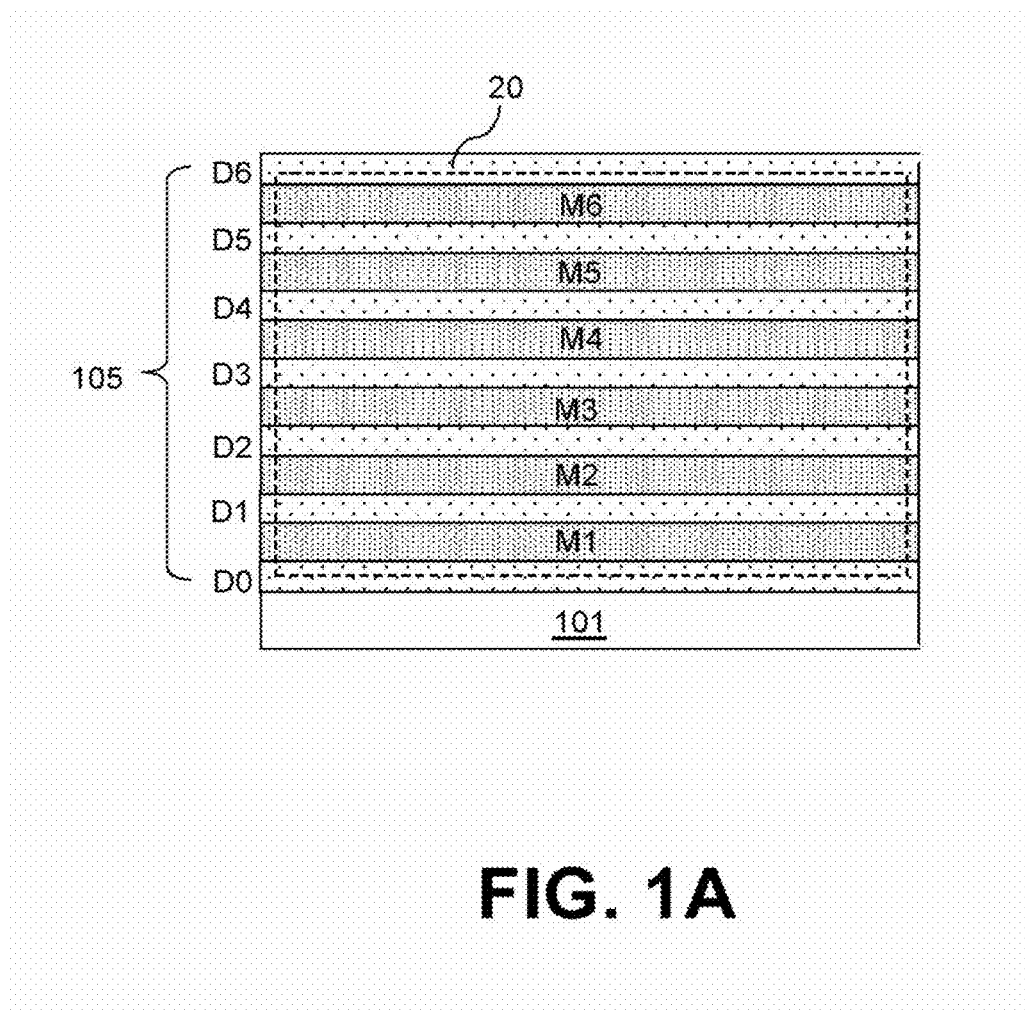
FIG. 1A is a cross-sectional view of an illustrative dielectric stack in accordance with one embodiment of the present invention.

FIG. 1A is a cross-sectional view of an illustrative dielectric stack 105 in accordance with one embodiment of the present invention. As shown in FIG. 1A, seven dielectric layers D0 to D6 are stacked together on top of a semiconductor substrate (e.g., substrate 101). The stacked dielectric layers D0 to D6 may collectively be referred to as dielectric stack 105. There are six metal layers M1 to M6 embedded between dielectric layers D0 to D6. Dielectric layers D0 to D6 may electrically isolate the metal layers M1 to M6 from each other. Metal layers M1-M6 may include metal routing paths formed in dielectric material and are therefore sometimes referred to as metal routing layers. Conductive via structures (not shown in FIG. 1A) may be positioned at designation locations in the dielectric layers D0-D6 so that electrical contacts may be formed between the metal layers. Dielectric layers D0-D6 may include vertical conductive vias and may therefore sometimes be referred to as via layers.

In general, dielectric stack 105 may include any number of alternating metal routing layer and via layers. As shown in FIG. 1A, dielectric layer D0 covers substrate 101 and isolates substrate 101 from metal layer M1. Dielectric layer D1 covers metal layer M1 and isolates metal layer M1 from metal layer M2. Similarly, dielectric layer D2 covers metal layer M2 and isolates metal layer M2 from metal layer M3. Dielectric layer D3 covers metal layer M3 and isolates metal layer M3 from metal layer M4. Dielectric layer D4 covers metal layer M4 and isolates metal layer M4 from metal layer M5. Dielectric layer D5 covers metal layer M5 and isolates metal layer M5 from metal layer M6. Dielectric layer D6 covers the metal layer M6. In one embodiment, dielectric layer D6 may be a passivation layer that protects metal layer M6 physically and electrically from external contaminants.

A capacitor structure may be formed in region 20 of dielectric stack 105. In one embodiment, the capacitor structure may include conductive segments (not shown) formed in the respective metal layers M1-M6. A more detailed description of the capacitor structure that may be formed in region 20 will be described later with reference to capacitor structure 100 FIG. 1B.

Figure 1B:
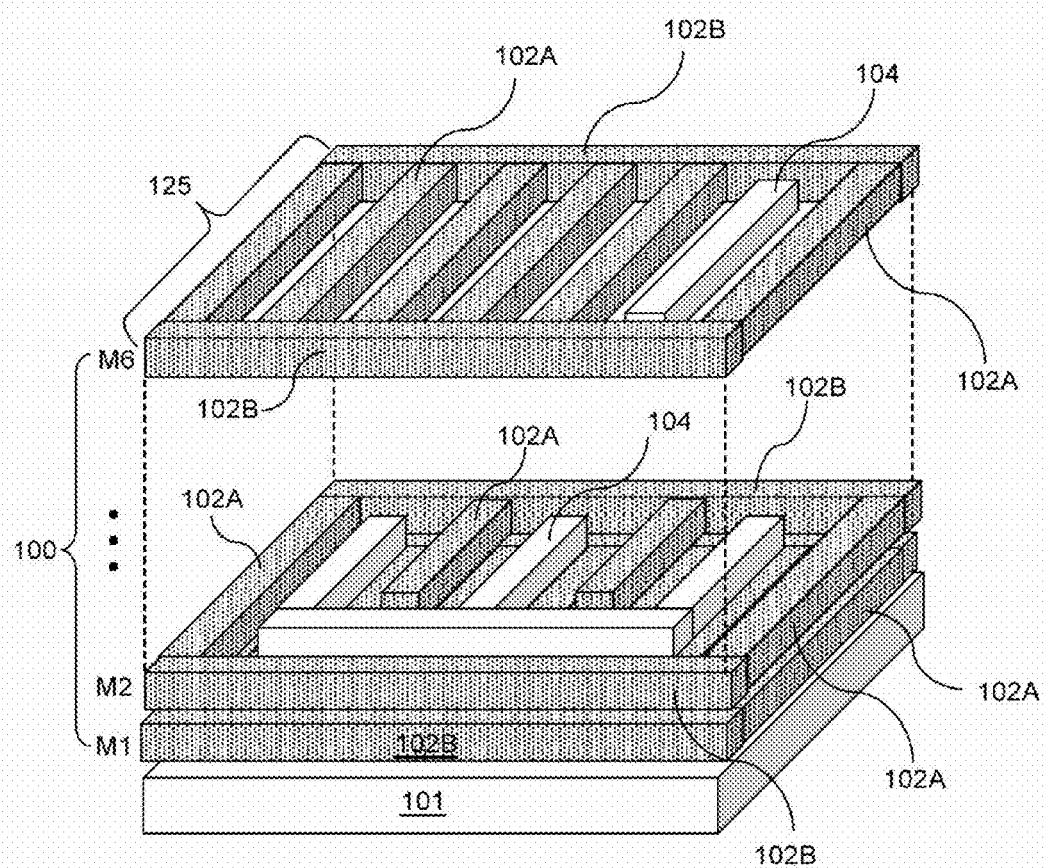
FIG. 1B is a perspective view of an illustrative capacitor structure in accordance with one embodiment of the present invention.

FIG. 1B is a perspective view of an illustrative capacitor structure 100 in accordance with one embodiment of the present invention. It should be appreciated that dielectric layers D0 to D6 of FIG. 1A are not shown for the sake of brevity. In one embodiment, capacitor structure 100 is a stacked capacitor structure formed above substrate 101. Capacitor structure 100 is formed in stacked metal layers (e.g., metal layers M1 to M6) in an integrated circuit. In one embodiment, each metal layer M1 to M6 may be constructed differently from one another. As shown in FIG. 1B, metal layer M1 may include conductive segments 102A and 102B. A more detailed description of the construction of metal layer M1 will be described later with reference to FIG. 2.

Metal layer M2 may include conductive segments 102A, 102B, and 104. Conductive segments 102A, 102B, and 104 may be isolated and insulated by the dielectric material in dielectric layers D5 and D6 of FIG. 1A. As shown in FIG. 1B, conductive segments 102A is spatially interleaved with a conductive structure that includes conductive segments 104. Conductive segments 102A may be coupled to a ground voltage level (not shown) and conductive segments 104 may be coupled to a power supply source (not shown). As such, conductive segments 102A and conductive segments 104 may collectively form a capacitor element, which may be part of capacitor structure 100.

Accordingly, conductive segment 102B may couple to conductive segments 102A in metal layer M2 may form a terminal shield for conductive segments 104 by laterally surrounding conductive segments 104 from at least three sides. Such an arrangement may increase capacitance density from sidewall coupling between conductive segments 102A, 102B, and 104. Metal layers M3-M5 may be constructed to be substantially similar to metal layer M2. As such, their respective structures and construction are not described and shown for the sake of brevity.

Metal layer M6 may include conductive segments 102A and 102B. Conductive segments 102A and 102B may be collectively referred to as conductive shielding structure 125. Conductive shielding structure 125 may laterally surround conductive segment 104 in layer M6. In one embodiment, conductive segment 104 is shorter than conductive segments 102B. Additionally, conductive shielding structure 125 may form a roof-like shielding structure that shields conductive segments 104 from neighboring circuitry.

Figure 1C:
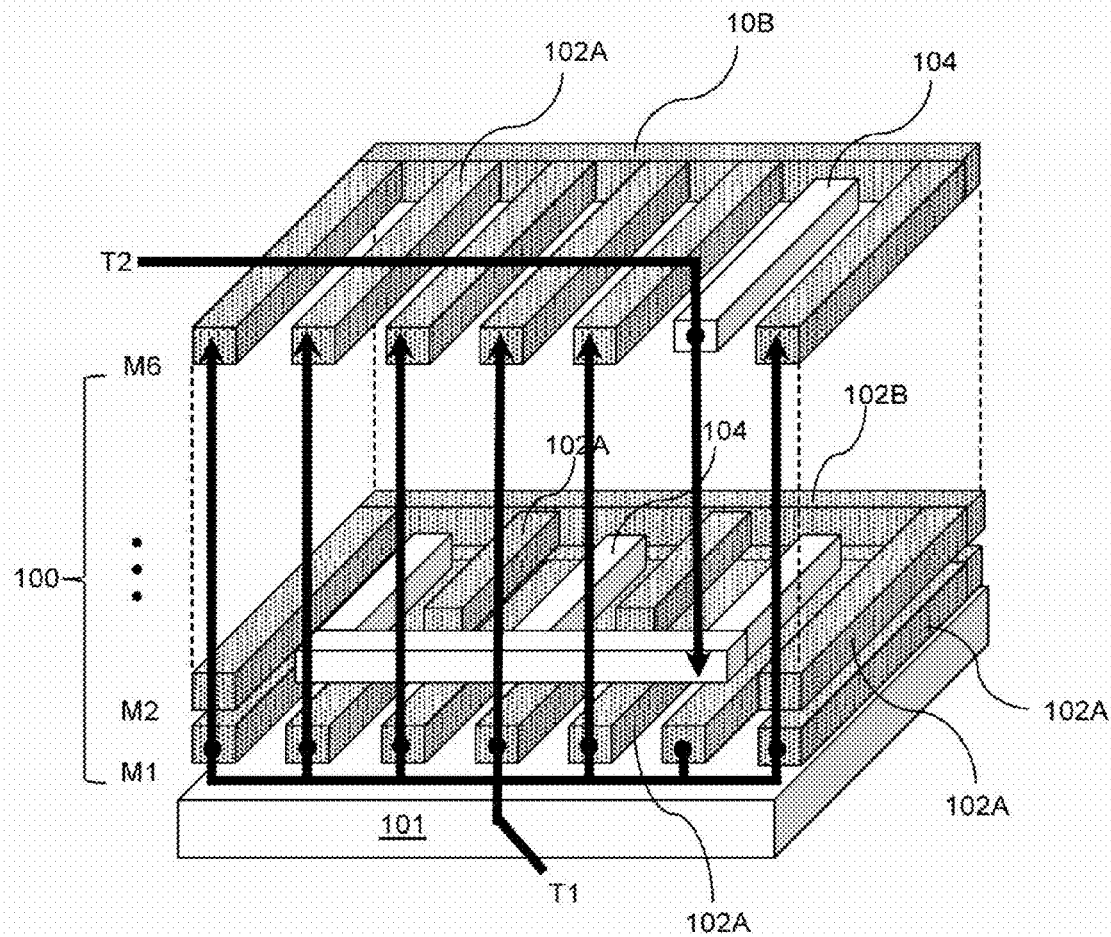
FIG. 1C is a perspective view of the illustrative capacitor structure connected to a first terminal and a second terminal in accordance with one embodiment of the present invention.

FIG. 1C is a perspective view of capacitor structure 100 of FIG. 1B connected to terminal T1 and terminal T2 in accordance with one embodiment of the present invention. It should be appreciated that a portion of conductive segments 102B of FIG. 1B from metal layers M1 to M6 are not shown so that connections of terminal T1 and terminal T2 may be shown in FIG. 1C. Substrate 101 may be connected with terminal T1 to a ground plane (not shown) that serves as an electrical grounding path for capacitor structure 100.

Conductive segments 102A and 102B (shown in FIG. 1B) are connected to one terminal (e.g., terminal T1) of capacitor structure 100 through a set of conductive via structures (not shown). Similarly, conductive segments 104 are connected to another terminal (e.g., terminal T2) of capacitor structure 100 via another set of conductive via structures (not shown). In one embodiment, terminal T1 may be connected to a ground voltage (e.g., $V_{SS}$) and terminal T2 may be connected to a power supply voltage (e.g., $V_{CC}$). In another embodiment, substrate 101 may be grounded at $V_{SS}$ while terminals T1 and T2 are biased at different signal voltages.

Figure 2:
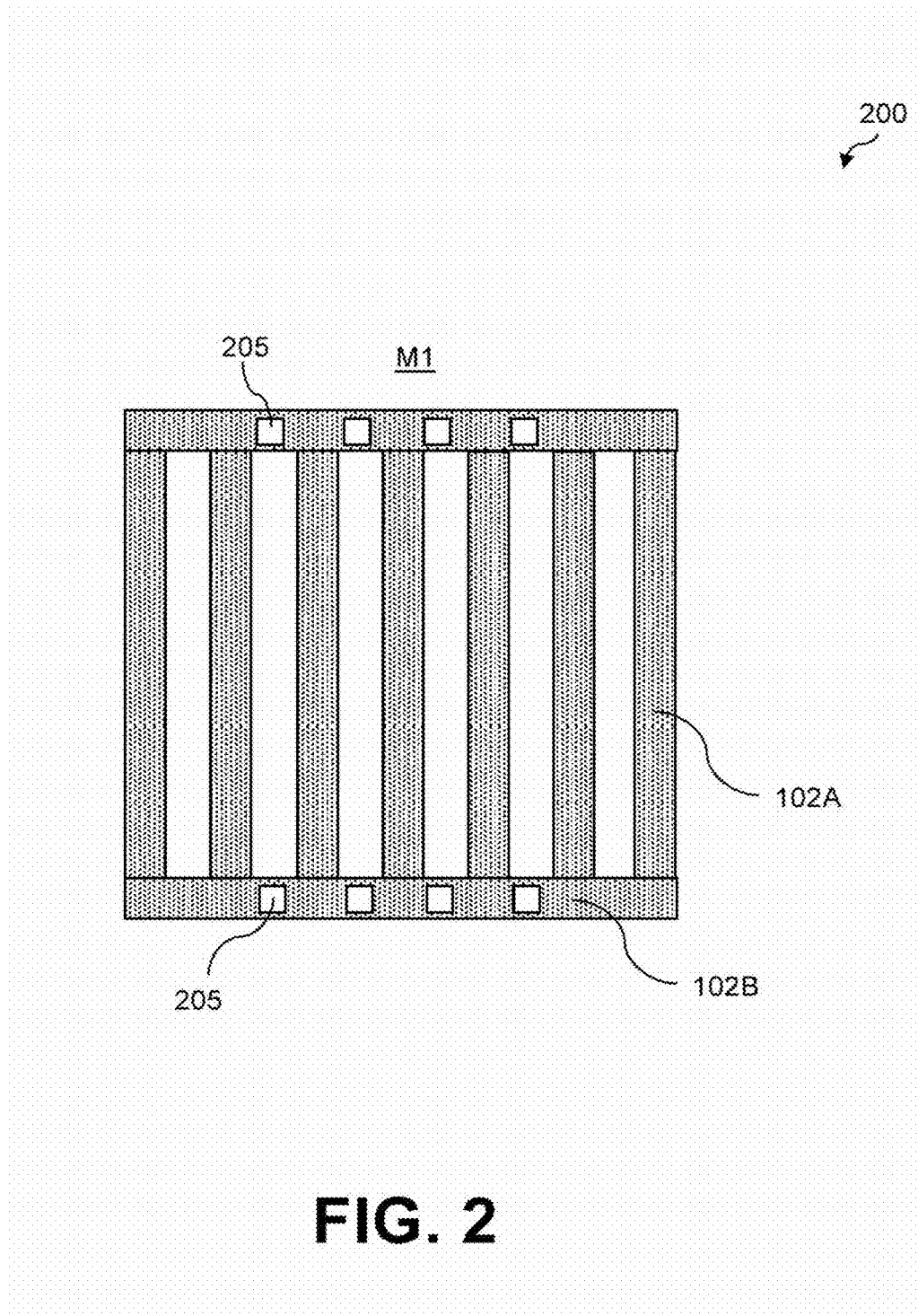
FIG. 2 is a top-view diagram of a conductive structure formed in a first metal layer of a dielectric stack in accordance with an embodiment of the present invention.

FIG. 2 is a top-view diagram of conductive structure 200 formed in a first metal layer (e.g., metal layer M1 of FIG. 1A) of dielectric stack 105 of FIG. 1A in accordance with an embodiment of the present invention. Conductive structure 200 may be part of capacitor structure 100 of FIG. 1B. Conductive structure 200 may include conductive segments 102A and 102B. Conductive segments 102A and 102B may be connected to terminal T1 of FIG. 1C. Conductive segments 102A are connected to each other through conductive segment 102B. As shown in FIG. 2, each conductive segment 102A may extend in parallel and may be placed adjacent to one another. Such an arrangement may form a conductive solid structure which may reduce coupling capacitance of capacitor structure 100 to environment and to ground of substrate 101 of FIGS. 1A-1C. Conductive via structures 205 may be fabricated above conductive segments 102B to form connections between two or more subsequent metal layers (e.g., metal layers M1 and M2) through one or more dielectric layers. For example, conductive via structures 205 may be plated through-hole via structures.

Figure 3:
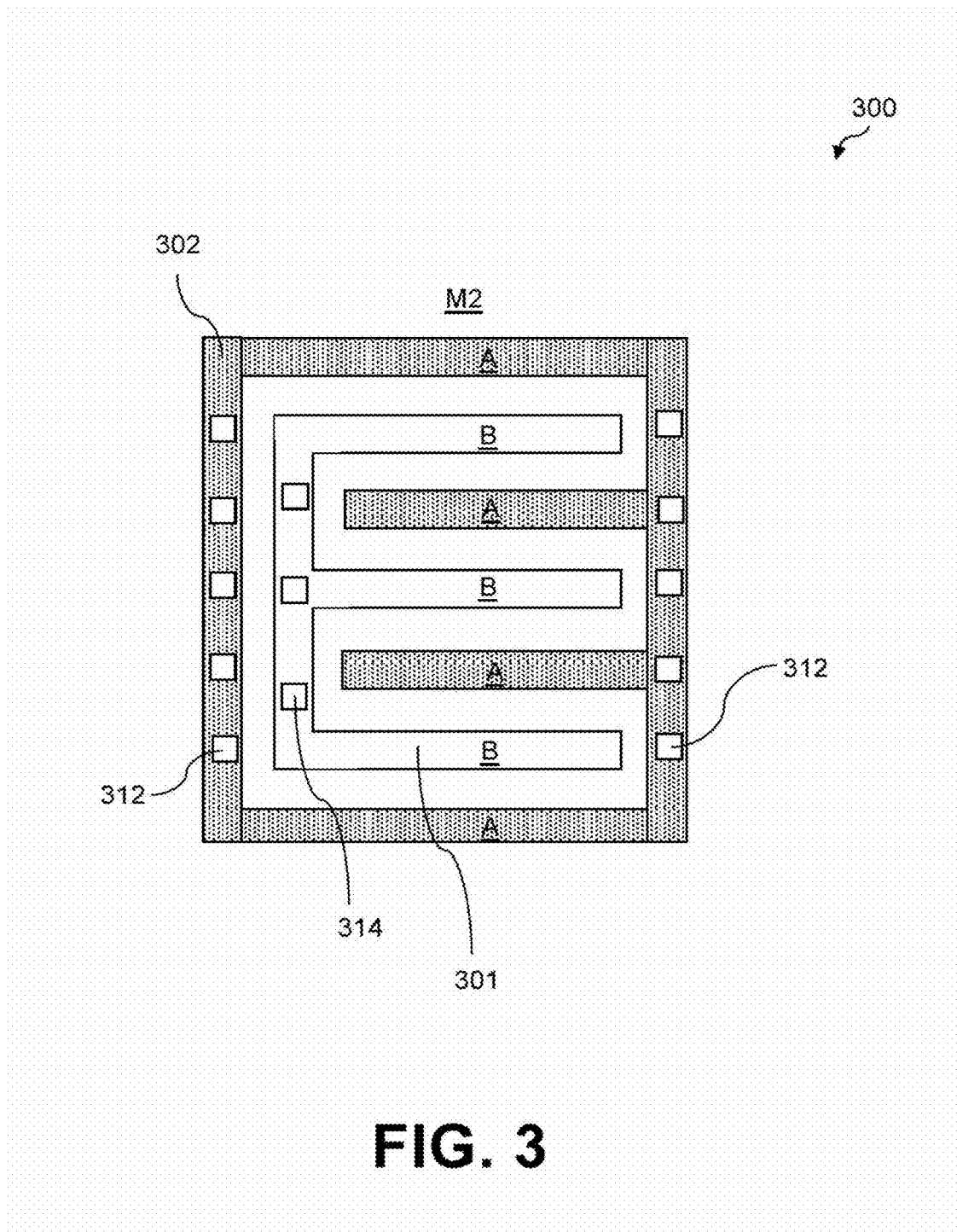
FIG. 3 is a top-view diagram of a sub-capacitor structure formed in a second metal layer of a dielectric stack in accordance with an embodiment of the present invention.

FIG. 3 is a top-view diagram of sub-capacitor structure 300 formed in metal layer M2 of dielectric stack 105 of FIG. 1A in accordance with an embodiment of the present invention. Sub-capacitor structure 300 may be part of capacitor structure 100 of FIG. 1B. Sub-capacitor structure 300 may include conductive structure 301 and conductive structure 302. Conductive segments B (also referred to as conductive fingers B) of conductive structure 301 may spatially interleave with conductive segments A of conductive structure 301. Additionally, conductive structure 302 may form a rectangular shielding structure that laterally surrounds conductive structure 301 in metal layer M2. Such an arrangement may increase capacitance density and reduce parasitic capacitance in conductive structure 301.

Conductive via structures 312 may be formed at designated locations above conductive shielding structure 302. Conductive via structures 312 may allow conductive shielding structure 302 and conductive segments A to connect with other conductive structures on different metal layers. Similarly, conductive via structures 314 may be formed at designated locations above conductive structure 301 to connect with other conductive structures on different metal layers. In general, conductive via structures may form vertical electrical connections between different layers of metals, or metal layers, in an electrical circuit.

Figure 4:
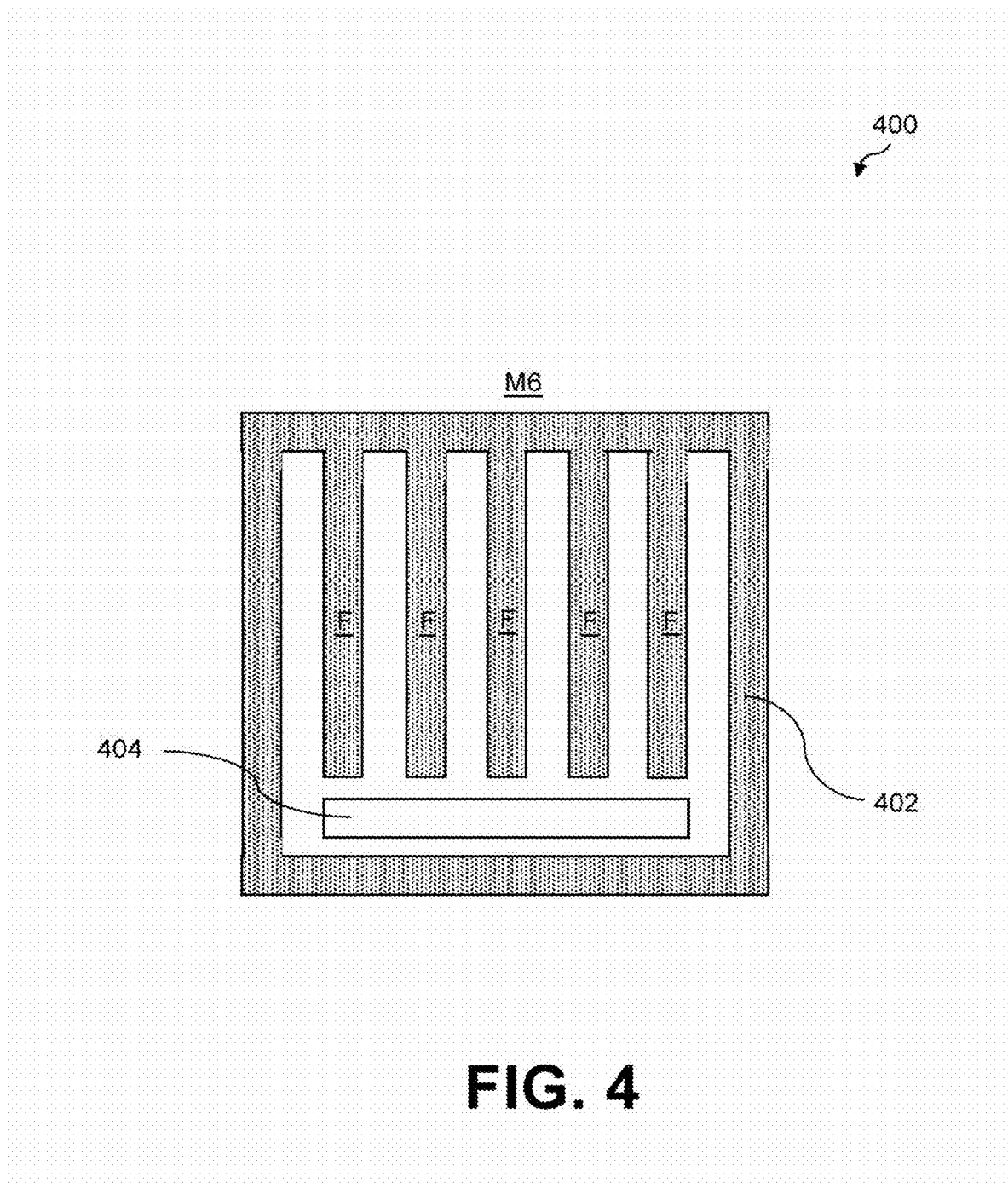
FIG. 4 is another top-view diagram of a sub-capacitor structure formed in a sixth metal layer of a dielectric stack in accordance with an embodiment of the present invention.
Figure 5:
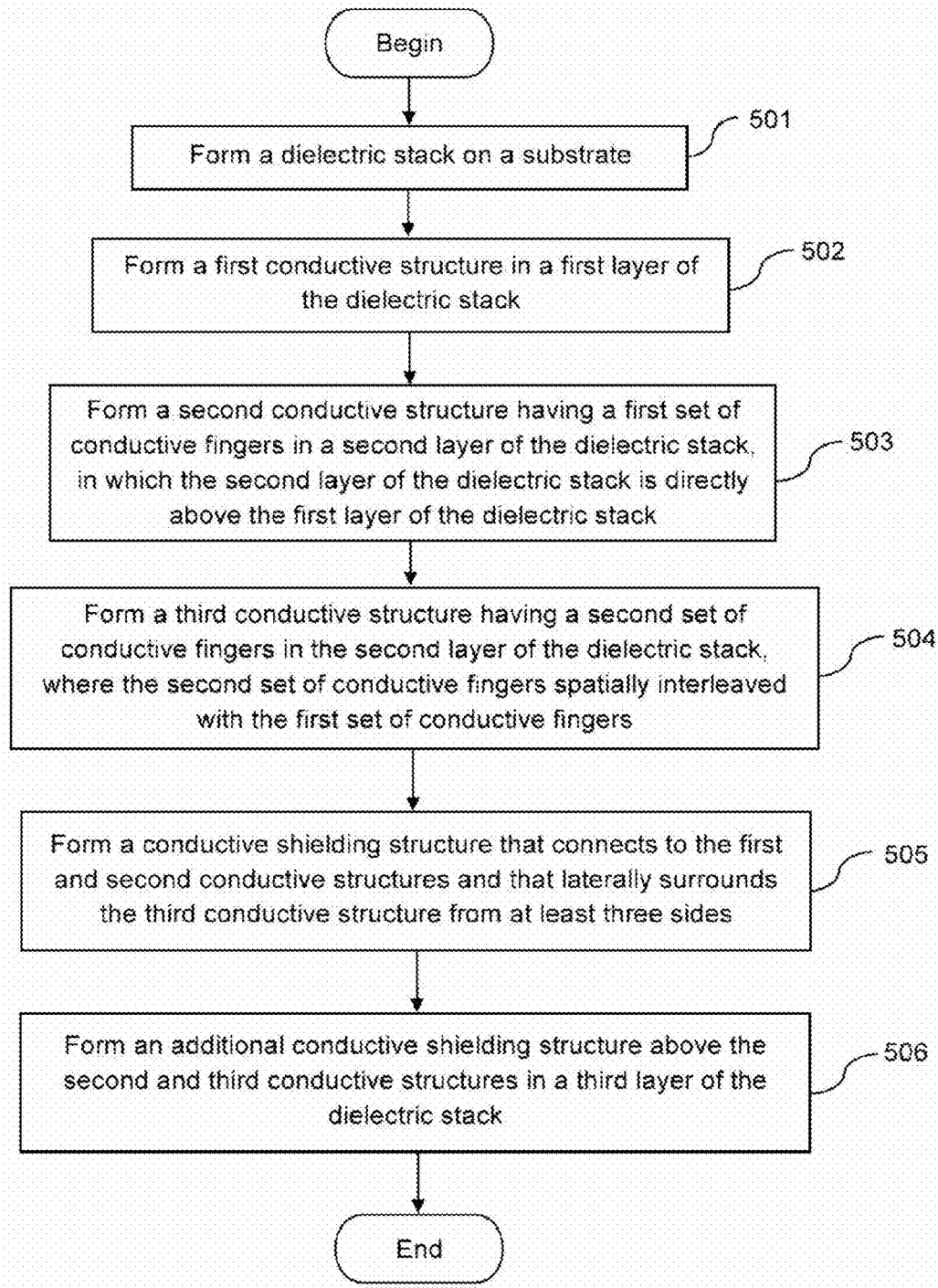
FIG. 5 is a flow chart of illustrative steps for fabricating a capacitor structure on a substrate in accordance with an embodiment on the present invention.

FIG. 4 is a top-view diagram of sub-capacitor structure 400 formed in metal layer M6 of dielectric stack 105 of FIG. 1A in accordance with an embodiment of the present invention. Sub-capacitor structure 400 may be part of capacitor structure 100 of FIG. 1B. Sub-capacitor structure 400 may include conductive shielding structure 402 and conductive segment 404. As shown in FIG. 5, conductive shielding structure 402 has a set of conductive segments F. Each conductive segment F is arranged adjacent to each other. Conductive segment 404 may be formed perpendicular to conductive segments F.

In one embodiment, conductive shielding structure 402 may completely surround, i.e., is continuous without any breaks, conductive segment 404. Additionally, conductive structure 510 may also form a roof-like shielding structure above conductive structure 301 of FIG. 3 in metal layer M3. The roof-like shielding structure may provide shielding to conductive structure 301 in order to create a parasitic capacitance balance between terminals T1 and T2 of capacitor structure 100.

FIG. 5 is a flow chart of illustrative steps for fabricating a capacitor structure (e.g., capacitor structure 100 of FIG. 1B) on a substrate (e.g., substrate 101 of FIGS. 1A, 1B and 1C) in accordance with an embodiment of the present invention. At step 501, a dielectric stack is formed on the substrate. For example, as shown in FIG. 1A, dielectric stack 105 is formed on top of substrate 101. Dielectric stack 105 may include multiple metal layers M1 to M6. It should also be appreciated that even though only six dielectric layers M1 to M6 are shown in the embodiment of FIG. 1A, more or fewer dielectric layers may be formed, depending on design requirements.

At step 502, a first conductive structure is formed in a first layer of the dielectric stack. For example, as shown in FIG. 2, conductive structure 200 may be formed in metal layer M1 of FIG. 1A. Conductive structure 200 may be connected to terminal T1 of capacitor structure 100 of FIG. 1C. Terminal T1, for example, may be connected to a grounding terminal formed on substrate 101.

At step 503, a second conductive structure having a first set of conductive segments is formed in a second layer of the dielectric stack, in which the second layer of the dielectric stack is formed directly above the first layer of the dielectric stack. For example, as shown in FIG. 3, conductive structure 302 may be formed in metal layer M2 of FIGS. 1A and 1B. Conductive structure 302 has a set of conductive segments A. Conductive structure 302 is connected to terminal T1 of FIG. 1C through conductive via structures 312.

At step 504, a third conductive structure (e.g., conductive structure 301 of FIG. 3) having a second set of conductive segments (e.g., conductive segment B of FIG. 3) is formed in the second layer (e.g., metal layer M2 of FIGS. 1A and 1B) of the dielectric stack 105. Conductive structure 301 is connected to terminal T2 of capacitor structure 100 of FIG. 1C. Terminal T2, for example, may be connected to a power supply voltage $V_{CC}$. In one embodiment, the conductive segments of the third conductive structure are spatially interleaved with the conductive segments of the second conductive structure. Such an arrangement may provide increased coupling capacitance between the conductive rotor blade structure and the conductive structure. For example, as shown in FIG. 3, conductive segments A and B are spatially interleaved to provide coupling capacitance between conductive structure 301 and conductive structure 302.

At step 505, a conductive shielding structure that connects to the first and second conductive structures and that laterally surrounds the third conductive structure from at least three sides is formed. As shown in FIG. 1B, a portion of conductive segments 102 forms a conductive shielding structure that laterally surrounds conductive segments 104 so that conductive segments 104 are shielded from the environment. Such an arrangement may remove end parasitic capacitance of conductive segments 104 and increase capacitance density between terminal T1 and terminal T2 that are connected to conductive segments 102A, 102B, and 104, respectively.

At step 506, an additional conductive shielding structure is formed above the second and third conductive structures in a third layer of the dielectric stack. For example, conductive shielding structure 402 from metal layer M6 of FIG. 4 may connect to conductive structure 200 from metal layer M1 of FIG. 2 and conductive structure 302 from metal layer M2 of FIG. 3 through conductive via structures 205 of FIG. 2 and conductive via structures 312 of FIG. 3, respectively. Conductive shielding structure 402 may form a roof-like shielding structure that shields above conductive structure 301 of FIG. 3. Such a shielding structure may further minimize uncertainty and variations in capacitance from capacitor structure 100 of FIG. 1B to unwanted stray capacitance effects (e.g., noises, cross talks).

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations have been described in a specific order, it should be understood that in alternative embodiments the described operations may be performed in a different order or other additional operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way. It will be obvious to one skilled in the art that the present exemplary embodiments may be practiced without some or all of these specific details described with reference to the respective embodiments. In other instances, well-known operations have not been described in detail in order not to unnecessarily obscure the present embodiments.

The foregoing is merely illustrative of the principles of this invention and various modifications can be made by those skilled in the art without departing from the scope and spirit of the invention.

What is claimed is:

1. A capacitor structure having first and second terminals, comprising:
    a substrate;
    a dielectric stack formed over the substrate;
    a first conductive segment that is formed in a first layer of the dielectric stack, wherein the first conductive segment is connected to the first terminal of the capacitor structure;
    a second conductive segment that is formed directly above the first conductive segment in a second layer of the dielectric stack, wherein the first and second layers are directly adjacent layers in the dielectric stack, and wherein the second conductive segment is connected to the first terminal of the capacitor structure;
    a third conductive segment that is formed in the second layer of the dielectric stack, wherein the third conductive segment is coupled to the second terminal of the capacitor structure; and
    a conductive shielding structure that is formed directly above the third conductive segment in a third layer of the dielectric stack, wherein the conductive shielding structure is coupled to the second conductive segment.

2. The capacitor structure defined in claim 1, wherein the first terminal of the capacitor structure is coupled to ground.

3. The capacitor structure defined in claim 1, further comprising:
    a conductive shielding segment that is formed in the second layer of the dielectric stack, wherein the conductive shielding segment is perpendicular to the second and third conductive segments, and wherein the conductive shielding segment is coupled the second conductive segment.

4. The capacitor structure defined in claim 1 wherein the third conductive segment is shorter than the second conductive segment.

5. The capacitor structure defined in claim 1 wherein the first conductive segment is electrically coupled to the second conductive segment through conductive vias.

6. The capacitor structure defined in claim 1, wherein the conductive shielding structure is electrically coupled to the second conductive segment through conductive vias.

7. The capacitor structure defined in claim 2 further comprising:
    a conductive structure that includes the first conductive segment, wherein the conductive structure is formed directly below the second and third conductive segments in the first layer of the dielectric stack.

8. An integrated circuit, comprising:
    a semiconductor substrate; and
    a plurality of dielectric layers formed on the semiconductor substrate, wherein a layer in the plurality of the dielectric layers comprises:
        a first conductive structure with a first plurality of conductive fingers;
        a second conductive structure with a second plurality of conductive fingers that is spatially interleaved with the first plurality of conductive fingers, wherein the first conductive structure and the second conductive structure form a capacitor structure; and
        a conductive shielding structure that connects to the first conductive structure and that laterally surrounds the second conductive structure from at least three sides.

9. The integrated circuit defined in claim 8 wherein another layer in the plurality of the dielectric layers comprises:
    an additional conductive shielding structure formed directly above the first and second conductive structures.

10. The integrated circuit defined in claim 9, wherein the additional conductive shielding structure comprises:
    a third conductive structure with a third plurality of conductive fingers; and
    a conductive segment that is surrounded by the third conductive structure, wherein the conductive segment is parallel with the third plurality of conductive fingers.

11. The integrated circuit defined in claim 10, wherein the first and third conductive structures are coupled to a first terminal of the capacitor structure, and wherein the second conductive structure and the conductive segment are coupled to a second terminal of the capacitor structure.

12. The integrated circuit defined in claim 8 wherein another layer in the plurality of the dielectric layers comprises:
    an additional conductive shielding structure that is formed in the another layer in the plurality of dielectric layers, wherein the another layer in the dielectric stack is directly below the layer in the dielectric stack.

13. The integrated circuit defined in claim 12, wherein the first conductive structure and the additional conductive shielding structure receive a first voltage, and wherein the second conductive structure receives a second voltage that is different than the first voltage.

14. The integrated circuit defined in claim 12, wherein the additional conductive shielding structure is electrically coupled to the first conductive structure through conductive via structures.

15. A method of fabricating a capacitor structure over a substrate, comprising:
    forming a dielectric stack on the substrate;
    forming a first conductive structure in a first layer of the dielectric stack;
    forming a second conductive structure with a first plurality of conductive fingers in a second layer of the dielectric stack, wherein the second layer of the dielectric stack is adjacent to and above the first layer in the dielectric stack;
    forming a third conductive structure with a second plurality of conductive fingers in the second layer of the dielectric stack, wherein the second plurality of conductive fingers is spatially interleaved with the first plurality of conductive fingers; and forming a conductive shielding structure that is connected to the first and second conductive structures and that laterally surrounds the third conductive structure from at least three sides.

16. The method defined in claim 15, further comprising:
forming an additional conductive shielding structure above the second and third conductive structures in a third layer of the dielectric stack.

17. The method defined in claim 16, wherein forming the additional conductive shielding structure comprising:
forming a fourth conductive structure with a third plurality of conductive fingers, wherein each conductive finger in the third plurality of conductive fingers extends in parallel to each other; and
forming a conductive segment that is surrounded laterally by the third conductive structure in the third layer of the dielectric stack, wherein the conductive segment is adjacent to the third plurality of conductive fingers.

18. The method defined in claim 17 further comprising:
coupling the first and second conductive structures and the fourth conductive structure to a first voltage; and
coupling the third conductive structure and the conductive segment to a second voltage that is different than the first voltage.

19. The method defined in claim 17, further comprising:
aligning the conductive segment above the third conductive structure so that the conductive segment is in electrical contact with the third conductive structure.

20. The method defined in claim 15 wherein forming the first conductive structure comprises forming a conductive solid layer that is attached to a ground terminal in the substrate.

\* \* \* \* \*